United States Patent
Zabar et al.

[11] Patent Number: 5,397,983
[45] Date of Patent: Mar. 14, 1995

[54] VIBRATION BASED DEENERGIZED CABLE DETECTOR AND METHOD

[75] Inventors: Zivan Zabar, Rego Park, N.Y.; Bernard R. S. Cheo, Teaneck, N.J.

[73] Assignee: Consolidated Edison Company of New York, Inc., New York, N.Y.

[21] Appl. No.: 7,538

[22] Filed: Jan. 22, 1993

[51] Int. Cl.$^6$ .............................. G01R 19/14
[52] U.S. Cl. .................... 324/133; 324/633; 73/579; 73/584
[58] Field of Search ........... 73/658, 579, 584; 324/66, 72, 76.49, 72.5, 133, 109, 633; 340/654

[56] References Cited

U.S. PATENT DOCUMENTS

| | | | |
|---|---|---|---|
| 2,451,769 | 10/1948 | Norton | 324/95 |
| 2,845,596 | 7/1958 | Dyer | 324/103 P |
| 3,351,856 | 11/1967 | Luttrell, Jr. | 324/99 R |
| 3,375,707 | 4/1968 | Neitz | 73/658 |
| 3,504,281 | 3/1970 | Cromer et al. | 324/109 |
| 3,771,356 | 11/1973 | Mitchell et al. | 73/658 |
| 3,889,525 | 6/1975 | Bailey | 73/579 |
| 3,997,839 | 12/1976 | Dreyfus | 324/109 |
| 4,209,779 | 6/1980 | Beck et al. | 340/683 |
| 4,500,838 | 2/1985 | Bloomer | 324/117 R |
| 4,528,502 | 7/1985 | Rocha | 324/117 R |
| 4,719,415 | 1/1988 | Menhart | 324/109 |
| 4,870,868 | 10/1989 | Gastgeb et al. | 73/649 |
| 5,029,101 | 7/1991 | Fernandes | 73/579 |
| 5,065,142 | 11/1991 | Green | 340/654 |

Primary Examiner—Kenneth A. Wieder
Assistant Examiner—Christopher M. Tobin
Attorney, Agent, or Firm—Brooks Haidt Haffner & Delahunty

[57] ABSTRACT

Measurements are taken perimetrically about power or feeder cables at equidistant spaced locations with one or more vibration transducers feeding an electronic measuring circuit sharply tuned to twice the fundamental frequency of the supply system. A substantially flat response around the cable indicates a deenergized cable, while an energized cable produces vibrations that vary sinusoidally in amplitude as the readings progress around the cable.

11 Claims, 3 Drawing Sheets

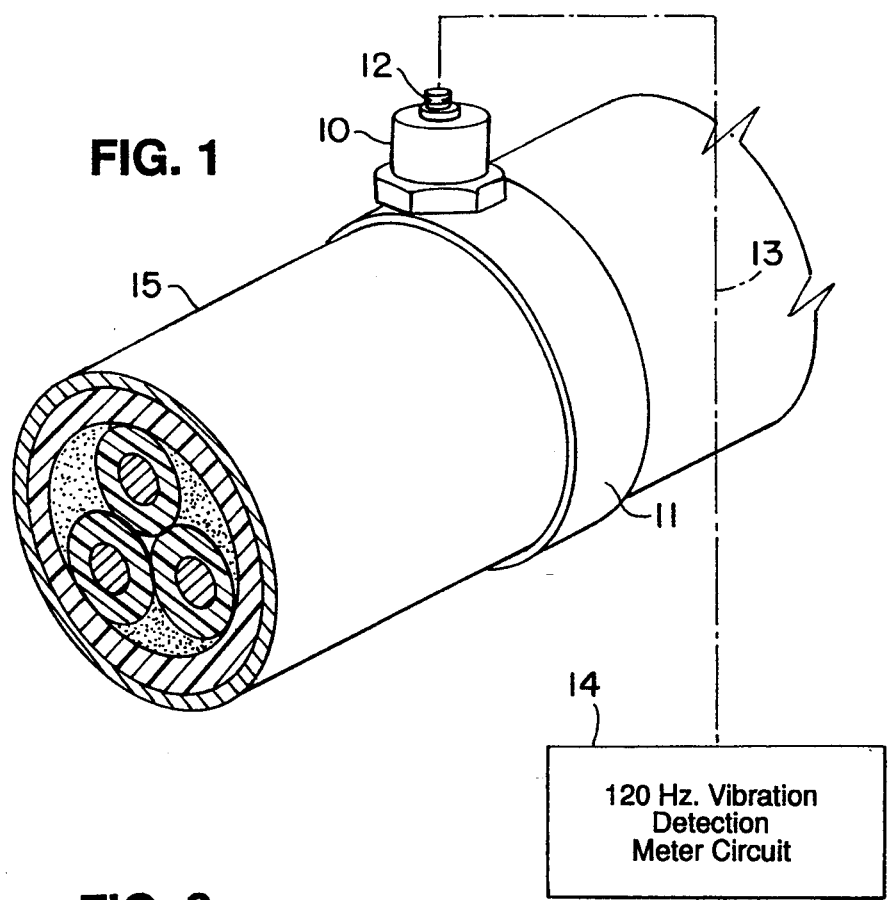
FIG. 1
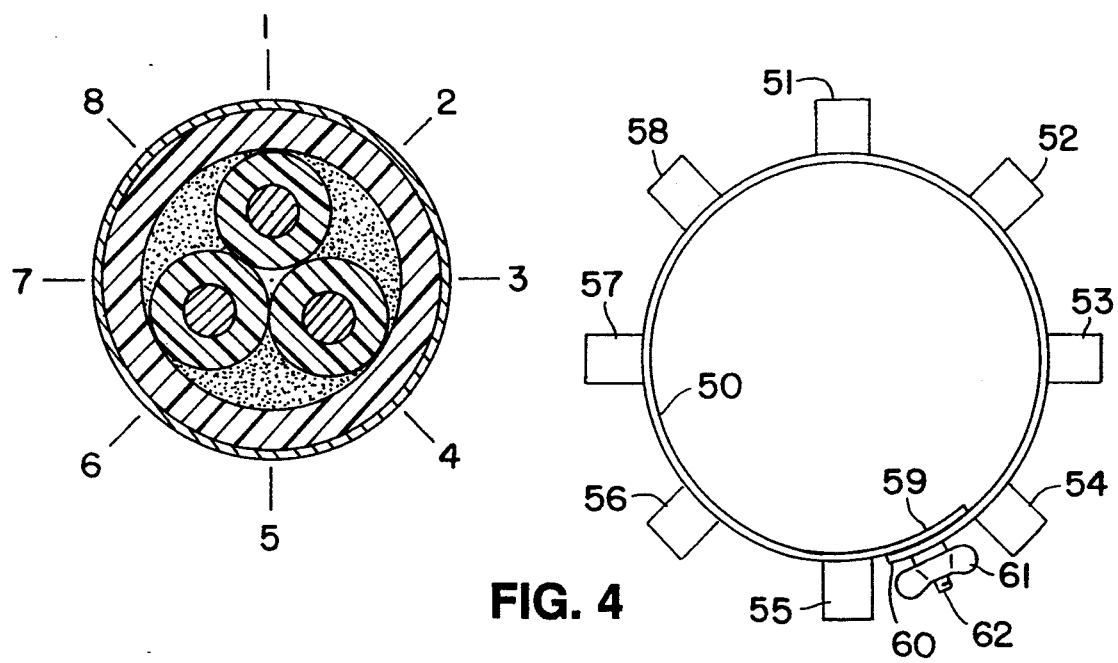
FIG. 3
FIG. 4

VIBRATION BASED DEENERGIZED CABLE DETECTOR AND METHOD

BACKGROUND OF THE INVENTION

The present invention relates to apparatus and method for determining the status of electric power cables in an alternating current supply system. More particularly, it relates to distinguishing between energized and deenergized cables in the field.

Heretofore, in order to repair a feeder the feeder would be disconnected from both sides and a tracing signal would be applied. This signal must be picked up by a special sensor at the repair site before any maintenance work may be started in order to be sure that the disconnected or dead feeder has been selected at the repair site from among a group of energized or live feeders. This requires coordination of operation at separated locations and is time consuming. As used herein, an energized or live cable is one with full voltage applied but not necessarily carrying load current. A deenergized cable is one with no voltage applied.

SUMMARY OF THE PRESENT INVENTION

The present invention provides means for identifying a "dead" feeder in a group of live ones or by itself without the need for a tracer signal. The invention is based on the recognition that a live feeder vibrates at a mechanical frequency of 120 Hz, double that of the electrical frequency of the system. The detector is operable on both transmission and distribution feeders, and on both multiconductor and shielded cables.

In accordance with one aspect of the present invention the provided apparatus comprises at least one vibration transducer with means for mechanically coupling the transducer to the exterior surface of a power cable, and means for indicating the magnitude of vibration sensed by the transducer at a predetermined frequency substantially equal to twice the supply system fundamental frequency.

In accordance with another aspect of the present invention there is provided a method for locating a dead or deactivated power cable which comprises the steps of determining the magnitude of vibration at substantially twice the supply system fundamental frequency at perimetrically spaced locations about the outer surface of the cable, and interpreting as indicative of a deenergized cable the detection of substantially the same low level of detectable vibration at each of the locations.

BRIEF DESCRIPTION OF THE DRAWINGS

The invention will be better understood after reading the following detailed description with reference to the appended drawings in which:

FIG. 1 is a partially perspective and partially diagrammatic view of a three-conductor three phase cable with a vibration sensor strapped around its outer perimeter feeding a 120 Hz vibration detection meter circuit;

FIG. 3 is a cross-sectional view of the cable of FIG. 1 with indicia marking the various locations by way of example at which measurements are made with the transducer of FIG. 1;

FIG. 4 is a diagrammatic view of a cinch strap with a plurality of transducers spaced perimetrically thereabout and representing a modification of the apparatus of FIG. 1;

The same reference numerals are used throughout the drawings to designate the same or similar part.

DETAILED DESCRIPTION OF THE PRESENTLY PREFERRED EMBODIMENTS

Figure 2:
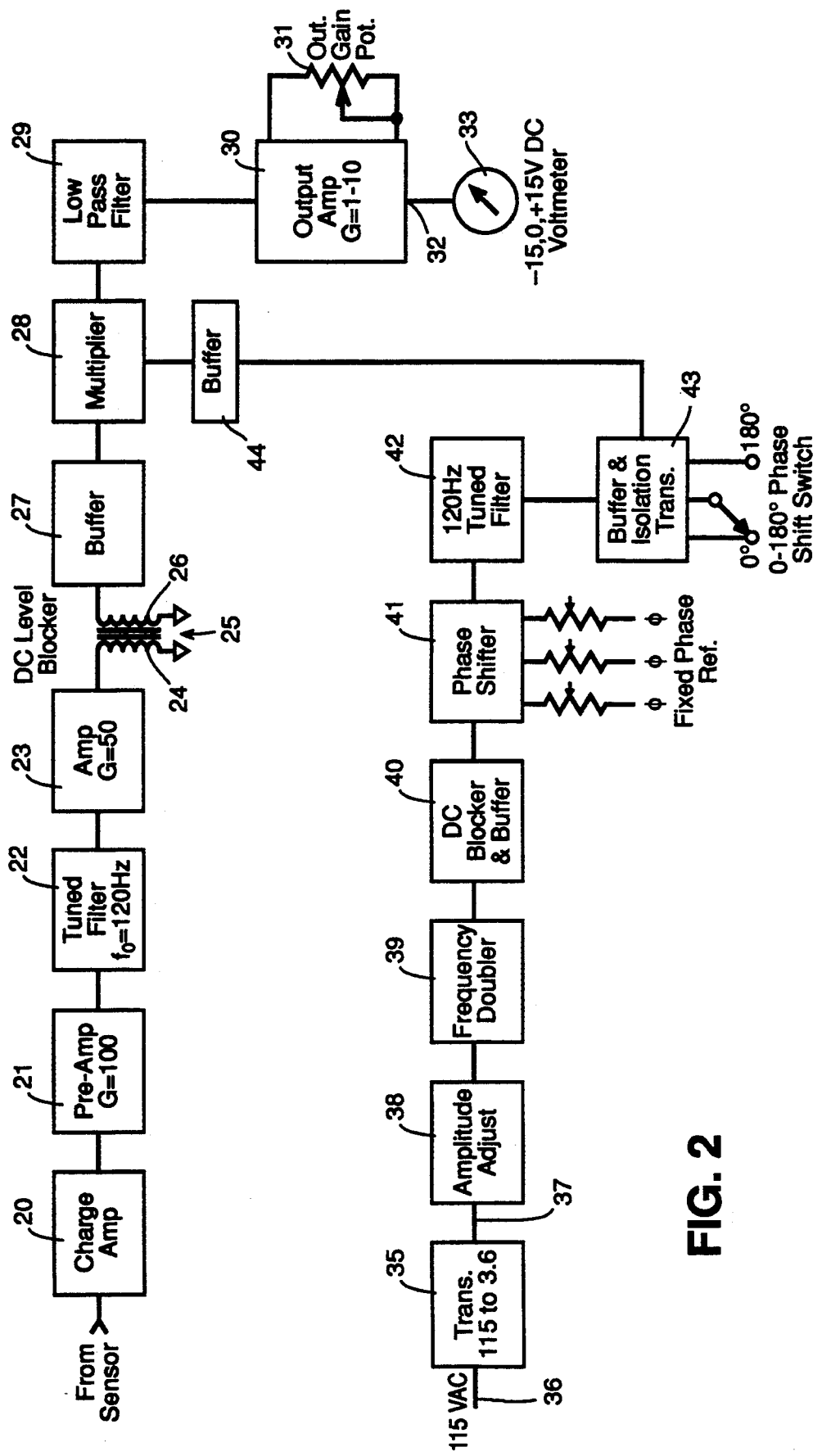
FIG. 2 is a block diagram of the vibration detection meter circuit of FIG. 1.

Referring to FIGS. 1 to 3, there is shown one embodiment of the apparatus for determining the status of electric power cables in an alternating current supply system, distinguishing between energized and deenergized cables. The embodiment illustrated in FIG. 1 has a vibration transducer 10 mounted on a cinch strap 11 with its electrical output terminal 12 connected, as represented by the dot-dash line 13, to a 120 Hz vibration detection meter circuit 14. For purpose of illustration the transducer 10 is shown strapped to the outer surface of a three-phase or three-conductor power cable 15. While not shown, it should be understood that the cinch strap 11 is discontinuous and provided with any suitable clamp or the like for securing the ends of the strap together. As an example, the strap 11 may be in the form of an ordinary hose clamp with a worm adjustment for tightening the strap about a cable.

The details of the meter circuit 14 are shown in FIG. 2 to which attention now should be directed. The connection 13 from the transducer sensor 10 connects to a charge amplifier 20 whose output is fed through a preamplifier 21, a tuned filter 22 tuned to a center frequency of 120 Hz, and an amplifier 23 to the primary winding 24 of a DC level blocking transformer 25. The secondary winding 26 of transformer 25 is connected through a buffer 27, a multiplier 28, and a low pass filter 29 to an output amplifier 30 having an adjustable output gain control 31 and an output 32 feeding a voltmeter 33.

The multiplier 28 is supplied with a phase controllable reference signal at 120 Hz by a circuit consisting of an input transformer 35 having an input 36 which can be connected to a source of AC system power at conventional line voltage, nominally 115 volts, and at 60 Hz.

The output 37 of transformer 35 is connected through an amplitude adjusting circuit 38, a frequency doubler 39, a DC blocker and buffer 40, a phase shifter 41, a 120 Hz tuned filter 42, and buffers and isolation transformer 43 and 44 to the multiplier 28.

An experimental tester that produced satisfactory results when tested was constructed with a Brüel & Kjaer Model 4370 Piezoelectric Accelerometer employed as a vibration transducer. According to its manufacturer this transducer has a sensitivity of 10±2% pC/ms$^{-2}$, accurate within 10% over a frequency range of 0.1 Hz to about 4.8 kHz, and within 5% over a frequency range of 0.2 Hz to about 3.5 kHz.

The charge amplifier 20 was a Brüel & Kjaer type 2635. During operation the output of the amplifier 20 passes through preamplifier 21 having a gain of about 100. Then the signal passes through filter 22, a narrow band-pass filter producing a narrow-band signal centered at 120 Hz. Next, the signal passes through amplifier 23 with a gain of 50. The signal is then coupled by transformer 25 to buffer 27 and into multiplier 28.

The reference signal is obtained at input 36 directly from the adjacent utility line and is doubled by doubler 39 to obtain the necessary 120 Hz sine-wave. This wave enters the phase shifter 41 through the buffer 40 after passing through a capacitor (not shown) that blocks the average component of the product output of the frequency doubler 39. The phase shifter permits the phase angle between the signal and the reference to be changed.

The output of multiplier 28 consists of a D.C. component and higher harmonic terms. The higher harmonic content is suppressed by the low-pass filter 29 so that only the D.C. component remains. It can be shown that the D.C. component is a function of the amplitude of the sensor output, the amplitude of the reference voltage, and the cosine of the phase angle $\theta$ between them. The output amplifier 30 provides additional gain to increase the readout range of the voltmeter 33.

To employ the test apparatus described above, the transducer 10 is strapped to the cable being checked and the location on the cable is marked. The output gain potentiometer 31 is adjusted for some median reading. Then the transducer 10 is moved perimetrically about the cable to different angular locations and readings are taken on the meter 33 without changing any adjustments until the point around the circumference of the cable is located that yields a maximum meter reading. When this point is located, the transducer 10 is strapped to the cable at that location and the gain control 31 is readjusted for maximum meter reading. Next, without changing any gain adjustments, the transducer is relocated to spaced positions perimetrically about the surface of the cable, for example, at 45° intervals, and readings of the meter 33 are noted. If the readings are substantially equal at the various locations about the cable it is safe to conclude that the cable is deenergized because an energized cable would produce readings varying sinusoidally in amplitude about the cable.

Figure 5:
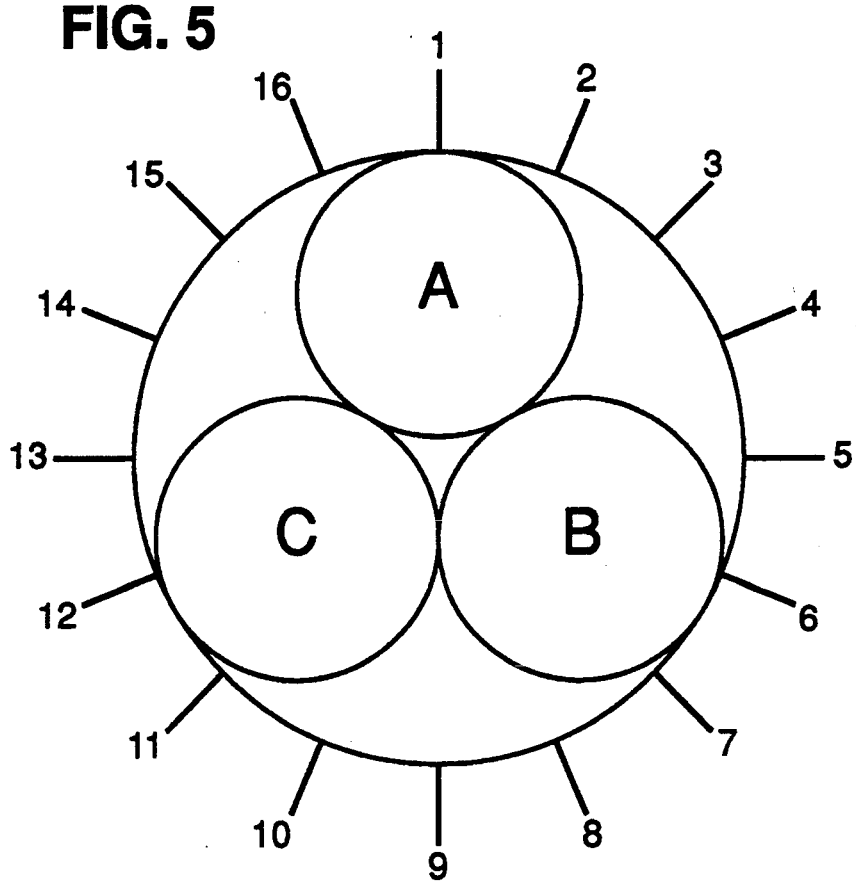
FIG. 5 is a schematic cross-section of a three-conductor cable for describing a modified method of taking the subject measurements.
Figure 6:
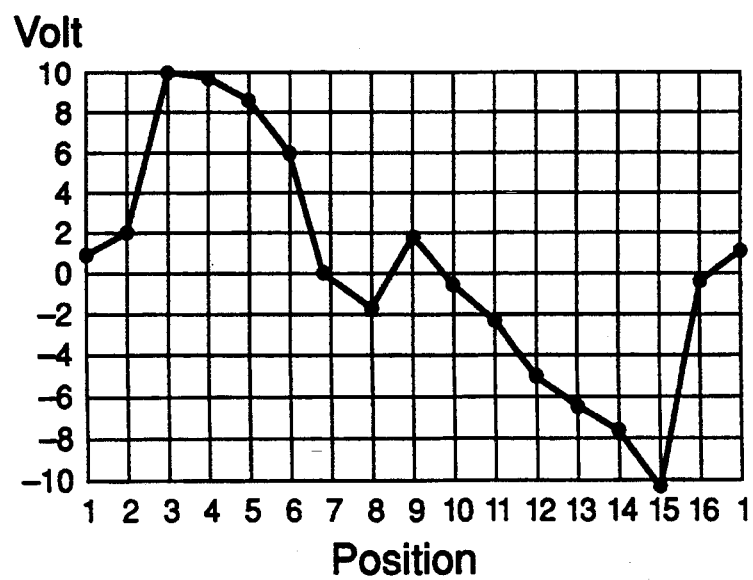
FIG. 6 is a graph of data obtained in the field with the apparatus of FIG. 1 used as indicated in FIG. 5 to take measurements at 16 equally spaced locations about a live cable.

Referring to FIGS. 5 and 6, actual readings were taken at approximately $22\frac{1}{2}°$ intervals about a live three phase feeder cable as shown diagrammatically in FIG. 5 wherein the individual phases are represented by the circles A, B and C, and the numbered positions 1 to 16 about the outer cable surface identify the locations of the transducer 10 at which readings were taken. In FIG. 6 the readings, taken at the positions shown in FIG. 5, are plotted with the positions along the X-axis and the voltage readings along the Y-axis. It should be apparent from FIG. 6 that the amplitude of detectable vibration about the perimeter of a live cable varies approximately sinusoidally about the cable.

Based upon both laboratory and field testing it is believed that taking readings at 45° intervals as indicated diagrammatically in FIG. 3 is sufficient to distinguish between a live and deactivated cable. The subject apparatus is effective for determining the energization status of any multiconductor or shielded cable. A cable such as that illustrated in FIG. 1, when carrying current, produces detectable surface vibrations by interaction between adjacent conductors due to their magnetic fields. Even with no current flowing through the conductors of the cable, but voltage applied, the electrostatic field interaction between adjacent conductors will cause vibrations which are detectable. A coaxial cable produces such vibrations by interaction electromagnetically and/or electrostatically between center conductor and outer shield. By taking readings perimetrically about the cable, background noise level effects are eliminated. Because of the sensitivity of the transducer, a significant reading on meter 33 will be obtained even with a deenergized cable. However, the readings around the cable will be of a low level and reasonably constant.

In order to avoid the time consuming operation of loosening the strap 11, repositioning the transducer 10, retightening the strap, and then taking the reading, the embodiment illustrated in FIG. 4 can be used. Instead of one transducer there are eight vibration transducers, 51 to 58, spaced equidistantly along the cinch strap 50. The strap 50 is shown as being discontinuous with ends 59 and 60 that overlap after being separated and spread apart to slip over a length of cable. Merely by way of example, a wing nut 61 is shown installed over a threaded stud 62. While not illustrated, the stud 62 is mounted on the end 59 of the strap and passes through a longitudinally oriented slot (not shown) in the end 60 of the strap. This permits adjustment of the strap to fit tightly about a cable. With the strap hugging the cable, the wingnut 61 is tightened to secure the strap to the cable.

When using the plural transducer embodiment of FIG. 4, a selector switch can be used to sequentially connect each of the transducers, 51 to 58, to a single meter circuit. Employing the set of eight transducers permanently mounted on the cinch strap 50 serves to eliminate error due to differences in hoop tension in addition to supporting more efficient operation. The mode of operation is similar to that with a single transducer. With the structure of FIG. 4 strapped tightly about a cable, measurements are taken from each transducer to locate the one with the maximum output. Then the detector circuit is adjusted to maximize the output from that particular transducer. Thereafter, readings are taken from all of the transducers without making any further change to the instrument settings. If the readings tend to vary sinusoidally about the perimeter of the cable, it is safe to assume that the cable is energized.

Although not evident from the drawing, at least the surface of the cinch straps, 11 and 50, that contacts a cable should be provided by electrically insulating material. The reason for this requirement is that feeder cables generally have an outer jacket or sheath of lead and it is important to avoid a double ground connection.

While a particular model and make of vibration transducer has been identified, any vibration transducer or sensor can be employed so long as it has a sensitivity on the order of that specifically identified. Similarly, a different frequency detecting circuit can be used so long as it is sharply responsive to signals at twice the fundamental frequency of the supply system.

Having described the present invention with reference to the presently preferred embodiments thereof, it should be understood that various changes in construction and operation can be adopted without departing from the true spirit of the invention as defined in the appended claims.

What is claimed is:

1. Apparatus for determining the status of electric power cables in an alternating current supply system, distinguishing between energized and deenergized cables, comprising at least one vibration transducer, means for mechanically coupling said transducer to the exterior surface of a power cable for sensing vibration at said exterior surface, and means for indicating the magnitude of said vibration sensed by said transducer that occurs at a predetermined frequency substantially equal to twice the supply system fundamental frequency.

2. Apparatus according to claim 1, wherein said supply system fundamental frequency is 60 Hz, and said predetermined frequency is 120 Hz.

3. Apparatus according to claim 1, wherein said means for coupling said transducer to a power cable comprises a cinch strap, and said transducer is mounted on said strap, at least the surface of said strap that contacts a cable being provided by electrically insulating material.

4. Apparatus according to claim 3, wherein said supply system fundamental frequency is 60 Hz, and said predetermined frequency is 120 Hz.

5. Apparatus according to claim 1, wherein there are a plurality of said vibration transducers, means are provided for mechanically coupling said transducers to said cable at spaced intervals perimetrically, and means are provided for sequentially indicating the magnitude of said vibration sensed by each of said transducers that occurs at said predetermined frequency.

6. Apparatus according to claim 5, wherein said transducers are mounted on an outer surface of a cinch strap, spaced equidistantly along said strap, for coupling to the outer surface of a power cable at equidistant perimetrically spaced positions, at least the surface of said strap that contacts a cable being provided by electrically insulating material.

7. Apparatus according to claim 6, wherein said supply system fundamental frequency is 60 Hz, and said predetermined frequency is 120 Hz.

8. The method for determining the status of electric power cables in an alternating current supply system, distinguishing between energized and deenergized cables, comprising in combination the steps of mechanically coupling at least one vibration transducer to the exterior surface of a power cable for sensing vibration at said exterior surface, and detecting vibration that occurs at a predetermined frequency substantially equal to twice the supply system fundamental frequency as indicative of an energized cable.

9. The method according to claim 8, wherein said vibration transducer is coupled to said cable at perimetrically spaced locations and the magnitude of detectable vibration at said predetermined frequency is ascertained at each of said locations, and interpreting as indicative of an energized cable the detection of a substantially sinusoidal variation in said ascertained vibration magnitudes from one location to the next perimetrically about the cable.

10. The method for determining the status of electric power cables in an alternating current supply system, distinguishing between energized and deenergized cables, comprising in combination the steps of determining the magnitude of vibration that occurs at substantially twice the supply system fundamental frequency at perimetrically spaced locations about the outer surface of the cable, and interpreting as indicative of a deenergized cable the detection of substantially the same low level of detectable vibration at each of said locations.

11. The method according to claim 10, wherein the supply system fundamental frequency is 60 Hz, and the magnitude of vibration at 120 Hz is determined at said spaced locations.

* * * * *